US 6,679,976 B2

(12) United States Patent
Baldwin et al.

(10) Patent No.: US 6,679,976 B2
(45) Date of Patent: *Jan. 20, 2004

(54) SYSTEM AND METHOD FOR PERFORMING SPUTTER DEPOSITION WITH MULTIPLE TARGETS USING INDEPENDENT ION AND ELECTRON SOURCES AND INDEPENDENT TARGET BIASING WITH DC PULSE SIGNALS

(75) Inventors: David Alan Baldwin, Annadale, VA (US); Todd Lanier Hylton, Vienna, VA (US)

(73) Assignee: 4Wave, Inc., Sterling, VA (US)

( * ) Notice: Subject to any disclaimer, the term of this patent is extended or adjusted under 35 U.S.C. 154(b) by 6 days.

This patent is subject to a terminal disclaimer.

(21) Appl. No.: 10/137,897

(22) Filed: May 2, 2002

(65) Prior Publication Data
US 2002/0189938 A1 Dec. 19, 2002

Related U.S. Application Data

(63) Continuation-in-part of application No. 09/810,687, filed on Mar. 16, 2001, now Pat. No. 6,402,904, and a continuation-in-part of application No. 09/810,688, filed on Mar. 16, 2001, now Pat. No. 6,402,900.

(51) Int. Cl.[7] ............................................. C23C 14/34
(52) U.S. Cl. ........................ 204/192.12; 204/298.03; 204/298; 204/298.08; 204/298.11
(58) Field of Search ............... 204/192.12, 192.13, 204/298.12, 298.03, 298.06, 298.08, 298.11

(56) References Cited

U.S. PATENT DOCUMENTS

| | | | |
|---|---|---|---|
| 3,583,361 A | 6/1971 | Landel, Jr. ................ 118/49.5 |
| 4,046,666 A | 9/1977 | McClanahan et al. ...... 204/298 |
| 4,278,890 A | 7/1981 | Gruen et al. ............ 250/492 B |
| 4,639,301 A | 1/1987 | Doherty et al. ......... 204/192.31 |
| 4,684,848 A | 8/1987 | Kaufman et al. ........ 315/111.81 |
| 4,805,555 A | 2/1989 | Itoh ........................... 118/719 |
| 5,064,520 A | 11/1991 | Miyake et al. .......... 204/192.11 |
| 5,089,104 A | 2/1992 | Kanda et al. ............ 204/192.11 |
| 5,114,556 A | 5/1992 | Lamont, Jr. ............. 204/192.12 |
| 5,303,139 A | 4/1994 | Mark ........................... 363/63 |
| 5,454,919 A | 10/1995 | Hill et al. ............... 204/192.11 |
| 5,651,865 A | 7/1997 | Sellers ................... 204/192.13 |
| 5,733,418 A | 3/1998 | Hershcovitch et al. . 204/192.11 |
| 5,770,023 A | 6/1998 | Sellers .................... 204/192.3 |
| 5,810,982 A | 9/1998 | Sellers ................... 204/298.08 |
| 5,962,080 A | 10/1999 | Tan et al. .................... 427/589 |
| 6,402,900 B1 * | 6/2002 | Baldwin et al. ........ 204/192.11 |
| 6,402,904 B1 * | 6/2002 | Baldwin et al. ........ 204/192.13 |
| 2001/0004047 A1 | 6/2001 | Kahn et al. ............ 204/192.11 |
| 2001/0045352 A1 | 11/2001 | Robinson et al. ...... 204/192.11 |

OTHER PUBLICATIONS

Zhurin et al. "Biased Target Deposition," Front Range Research, Fort Collins, Colorado rec'd May 27, 1999; accepted Sep. 2, 1999, pp. 37–41.

* cited by examiner

Primary Examiner—Steven H. VerSteeg
(74) Attorney, Agent, or Firm—Morgan, Lewis & Bockius LLP

(57) ABSTRACT

A system and method for performing sputter deposition includes at least one ion source that generates at least one ion current directed at first and second targets, at least one electron source that generates at least one electron current directed at the first and second targets, and circuitry that biases the first and second targets with independent first and second DC voltage pulse signals. A first current sensor, coupled to the biasing circuitry, monitors a positive current and a negative current from the first target during one or more cycles of the first DC voltage pulse signal, and a second current sensor, coupled to the biasing circuitry, monitors a positive current and a negative current from the second target during one or more cycles of the second DC voltage pulse signal. A controller, coupled to the first and second current sensors, varies the at least one ion current independently from the at least one electron current.

25 Claims, 9 Drawing Sheets

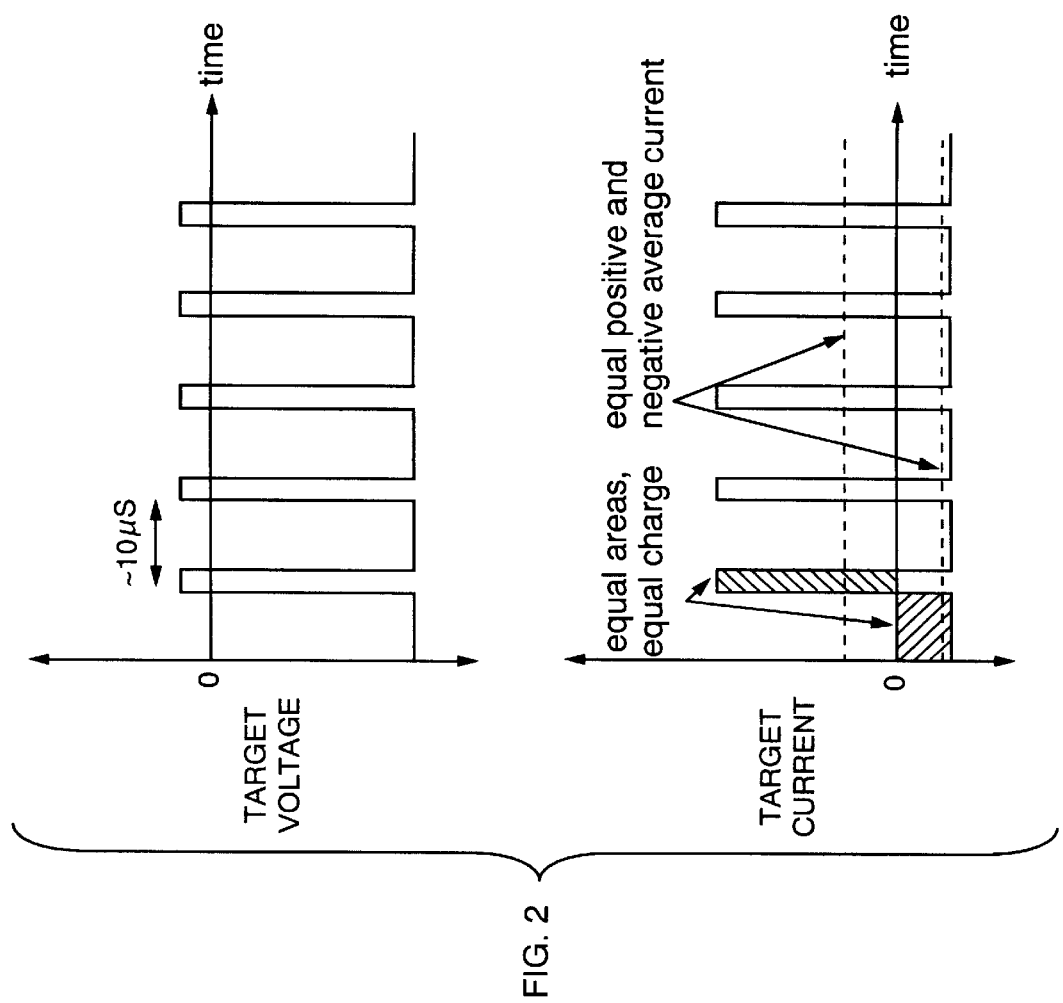

SYSTEM AND METHOD FOR PERFORMING SPUTTER DEPOSITION WITH MULTIPLE TARGETS USING INDEPENDENT ION AND ELECTRON SOURCES AND INDEPENDENT TARGET BIASING WITH DC PULSE SIGNALS

CROSS-REFERENCE TO RELATED APPLICATIONS

The present application is a continuation-in-part of U.S. patent application Ser. No. 09/810,687, filed Mar. 16, 2001, now U.S. Pat. No. 6,402,904, issued Jun. 11, 2002. entitled "*System and Method for Performing Sputter Deposition Using Independent Ion and Electron Current Sources and a Target Biased with an A-Symmetric Bi-Polar DC Pulse Signal*" (incorporated herein by reference) and U.S. patent application Ser. No. 09/810,688, filed Mar. 16, 2001, now U.S. Pat. No. 6,402,900, issued Jun. 11, 2002, entitled "*System and Method for Performing Sputter Deposition Using Ion Sources, Targets and a Substrate Arranged About the Faces of a Cube* (also incorporated herein by reference.)

FIELD OF INVENTION

The present invention is directed generally to novel systems and methods for performing sputter deposition, and to optical devices manufactured using such systems and methods.

BACKGROUND OF THE INVENTION

Conventional pulsed target plasma sputtering systems generate their plasma via application of 10 to 500 kHz pulsed DC power to a sputter target. Most commonly, magnetic fields of several times 0.01 Telsa are disposed proximate to the target to intensify the plasma formed. During negative pulses, ions drawn from the plasma sputter the target, and material from the target is deposited on a substrate. It is believed that electrons from the plasma neutralize charge on the target during parts of the pulse cycle when the negative voltage is off. It is believed that in a conventional pulsed-target plasma sputtering apparatus, the target pulsing power supply must provide a high-voltage leading edge, for the purpose of ignition of the plasma, on every pulse. While it is believed that a system comprising the application of a-symmetric bi-polar DC pulse signals for such a purpose is known, such systems in the prior art require complicated circuitry and such systems fail to provide means for independently controlling the ion currents and the electron currents at the target. Moreover, since the plasma ignition is partly a stochastic event/process, there is a degree of process uncertainty and instability. It would be beneficial to provide a system that provides better control of the process without adding complex circuitry to the apparatus arrangement.

It would also be beneficial to provide a system for independently controlling the ion and electron currents of multiple targets that are sputtered simultaneously to deposit a film. Furthermore, it would be beneficial to provide a system that minimized cross-contamination effects between targets when multiple targets are sputtered simultaneously.

SUMMARY OF THE INVENTION

The present invention is directed to a system for performing sputter deposition on a substrate. Biasing circuitry biases the target with an a-symmetric bi-polar DC voltage pulse signal. The biasing circuitry is formed from a positive voltage source with respect to ground, a negative voltage source with respect to ground and a high frequency switch. At least one current sensor, coupled to the biasing circuitry, monitors a positive current and a negative current from the target during one or more cycles of the a-symmetric bi-polar DC voltage pulse signal. A control system, coupled to the at least one current sensor, varies the ion current independently from the electron current. The ion and electron sources create a continuous plasma that is proximate the target and the biasing circuitry causes the target to alternately attract ions and electrons from the plasma. The ions attracted from the plasma sputter the target, and material from the target is deposited on the substrate. The electrons attracted from the plasma neutralize accumulated charge on the target. In one embodiment, the controller varies the a-symmetric bi-polar DC voltage pulse signal used to bias the target independently from the ion and electron currents. In this embodiment, target voltages and currents are tailored to optimize film deposition parameters.

In accordance with a further aspect, the present invention is directed to a multi-target system and method for performing sputter deposition, where at least one ion source generates ion current directed at first and second targets, and at least one electron source generates electron current directed at the first and second targets. In this embodiment, circuitry biases the first target with a first DC voltage pulse signal and the second target with a second DC voltage pulse signal that is independent of the first DC voltage pulse signal. The biasing circuitry is formed from at least one voltage source with respect to ground, a first high frequency switch used to form the first DC voltage pulse signal, and a second high frequency switch used to form the second DC voltage pulse signal. A first current sensor, coupled to the biasing circuitry, monitors a positive current and a negative current from the first target during one or more cycles of the first DC voltage pulse signal, and a second current sensor, coupled to the biasing circuitry, monitors a positive current and a negative current from the second target during one or more cycles of the second DC voltage pulse signal. A controller, coupled to the first and second current sensors, varies the ion current independently from the electron current. The at least one ion source and the at least one electron source create a continuous plasma proximate the first and second targets, and the biasing circuitry causes the first and second targets to alternately attract ions and electrons from the plasma. The ions attracted from the plasma sputter the first and second targets and material from the first and second targets is deposited on a substrate. The electrons attracted from the plasma neutralize accumulated charge on the first and second targets.

In accordance with embodiment of the above multi-target invention, material from the first target deposited on the substrate corresponds to a first component of an alloy/compound, and material from the second target deposited on the substrate corresponds to a second component of the alloy/compound. In this embodiment, the controller varies a composition ratio of the first and second components of the alloy/compound deposited on the substrate by independently varying a number of negative pulses per unit time in each of the first and second bi-polar DC voltage pulse signals. The controller optionally varies the composition ratio over time such that the composition ratio of alloy/compound deposited on the substrate varies throughout a thickness of a film deposited on the substrate. For example, the controller can vary the process parameters over time such that the composition ratio of alloy/compound deposited on the substrate varies linearly, in a sinusoidal or parabolic fashion, as a step function, or in some other fashion throughout a thickness of a film deposited on the substrate.

In accordance with a still further aspect of the above multi-target invention, the face of the first target is arranged such that it is outside of a line-of-sight of the face of the second target, and the face of the second target is outside of a line-of-sight of the face of the first target.

In accordance with a still further aspect of the above multi-target invention, multiple ion and electron sources are used to supply independent ion and electron currents to each of the targets. In this embodiment, a first ion source generates a first ion current directed at the first target and a second ion source generates a second (independent) ion current directed at the second target, a first electron source generates a first electron current directed at the first target and a second electron source generates a second (independent) electron current directed at the second target. In this embodiment, the controller varies the first ion current independently from the first electron current, and the controller varies the second ion current independently from the second electron current.

BRIEF DESCRIPTION OF THE DRAWINGS

Throughout the accompanying drawings like numerals are used to identify like elements. The drawings illustrate presently preferred embodiments of the invention, and, together with the general description given above and the detailed description given below, serve to explain features of the invention. In the Drawings:

FIG. 2 shows an exemplary a-symmetric bi-polar DC pulse signal used for biasing a target, together with diagrams showing sensed electron and ion currents at the target during several cycles of the a-symmetric bi-polar DC pulse signal, according to the present invention.

DETAILED DESCRIPTION OF THE PREFERRED EMBODIMENTS

Figure 1:
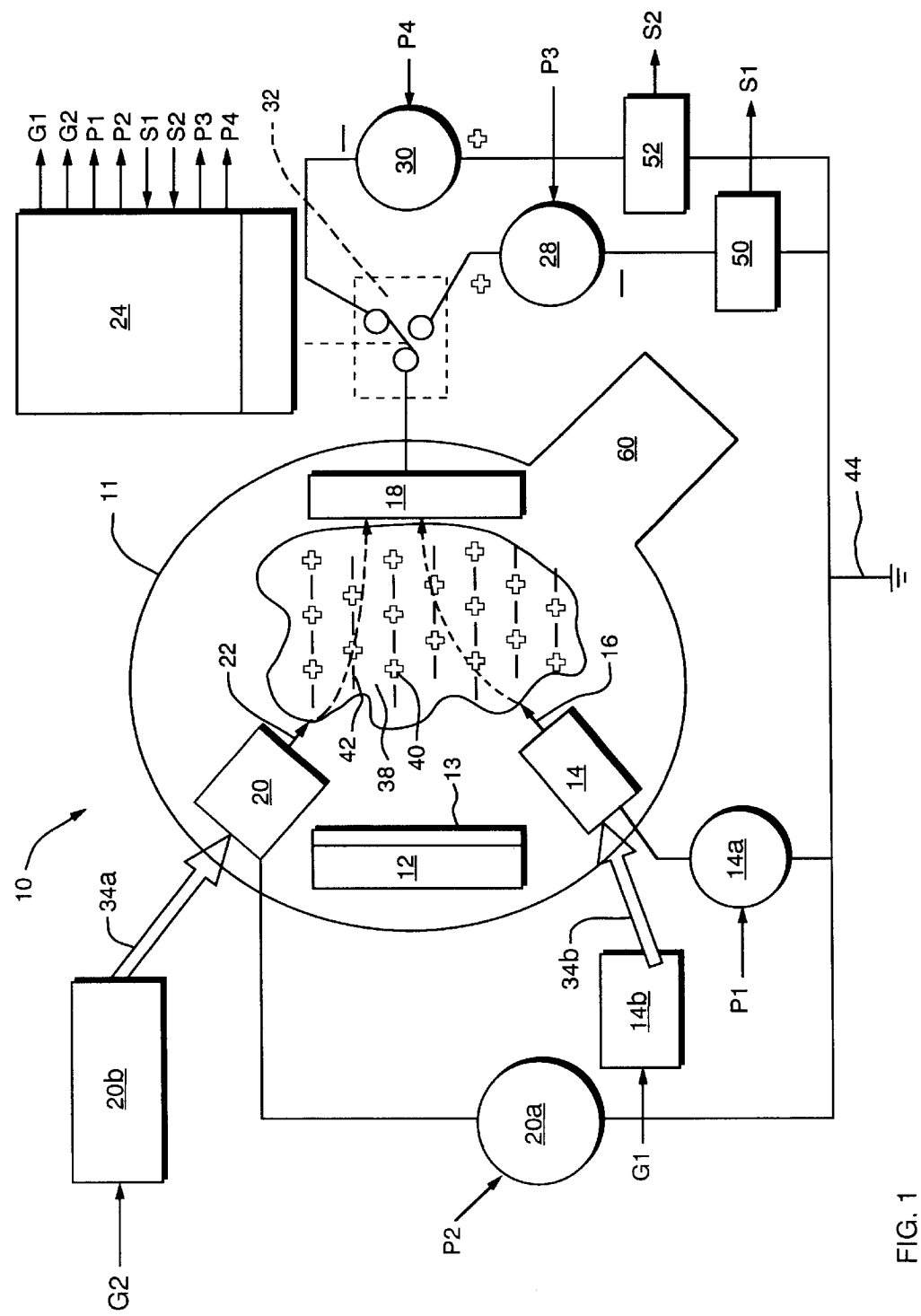
FIG. 1 is a schematic diagram of the system for performing sputter deposition using independent ion and electron sources and a target biased with an A-Symmetric BI-Polar DC pulse signal according to the present invention.

There is shown in FIG. 1, a system 10 for performing sputter deposition on a substrate 12. System 10 comprises an ion source 14 that generates an ion current 16. The ion current 16 is directed primarily at a target 18. System 10 further comprises an electron source 20 that generates an electron current 22. The electron current 22 is directed at the target 18. The ion source 14, the electron source 20 and the target 18 are disposed in a chamber 11. A vacuum pump 60 reduces the pressure within the chamber 11. The pressure within the chamber 11 during operation is about $10^{-2}$ to $10^{-5}$ Torr.

Exemplary ion sources useful for implementing the present invention include end-Hall or closed drift Hall Ion sources such as the Mark II™ source of Commonwealth Scientific Corp. In one embodiment, each ion source is a divergent ion current source that generates a divergent ion beam characterized by an ion current distribution that varies in accordance with the equation: ion current=$J_o \cos(\theta)$; where $\theta$ is an angle between the central axis of the divergent ion beam and a direction of the ion current, and $J_o$ is the ion current density along the central axis. Exemplary electron sources useful for implementing the present invention include hollow cathode electron sources such Commonwealth Scientific Corp.'s HCES5000 or a plasma bridge electron source such as that offered by Commonwealth Scientific Corp. or Veeco Instruments.

A gas 34b (for example, Ar, Xe, $N_2$, or $O_2$) is supplied by a gas controller 14b (or mass flow controller) to ion source 14. The volume of gas output by gas controller 14b is varied by process controller 24. An ion source power supply 14a is coupled to the ion source 14, and supplies a control voltage to ion source 14. The output of ion source power supply 14a is varied by process controller 24. Control signals (from process controller 24) are supplied to both the ion source power supply 14a, and the ion source gas controller 14b, in order to vary the magnitude of ion current 16 at target 18. In one embodiment, ion current 16 will vary linearly with changes in the flow rate of gas 34b supplied to ion source 14. In addition, for a given flow rate of gas 34b supplied to ion source 14, the ion current 16 generated from the ion source and flowing toward target 18 will vary proportionately with the magnitude of the voltage control signal supplied by ion source power supply 14a to ion source 14.

A gas 34a (for example, Ar, Xe or $N_2$) is supplied to electron source 20 by a gas controller (or mass flow controller) 20b. Gas 34a may be of a different type than gas 34b. The volume of gas output by gas controller 20b is varied by process controller 24. An electron source power supply 20a supplies a control voltage to electron source 20. The voltage supplied to electron source 20 by electron power supply 20a is varied by process controller 24. It will be understood by those skilled in the art that by varying the quantity of gas 34a supplied to electron source 20 and the voltage supplied by electron source power supply 20a to electron source 20, the electron current emanating from electron source 20 toward the sputtering target 18 may be controlled. In one embodiment, so long as a minimum quantity of gas 34a is supplied to electron source 20, the magnitude of the electron current 22 will vary linearly based on the magnitude of the signal supplied by the electron source power supply 20a to the electron source 20.

System 10 further includes a pair of current sensors 50, 52. Each of the current sensors has an output that is coupled to process controller 24. Each current sensor preferably includes a low pass filter with a time constant that is relatively long when compared with the frequency of switch 32 (e.g., about 100 kHz.) Each current sensor 50, 52, supplies a signal S1, S2, respectively, to process controller 24 that is proportional to the output of its corresponding voltage source 28, 30, averaged over time. Although in the embodiment shown, current sensors 50, 52 are shown as being disposed between voltage sources 28, 30, respectively, and ground, the current sensors 50, 52 could be positioned at any location in the circuitry useful for measuring the positive and negative currents at or near target 18.

Process controller 24 regulates the positive and negative currents at target 18 by varying independently the ion and electron currents 16, 22 with control signals P1, P2 to power supplies 14a, 20a, and control signals G1, G2 to gas controllers 14b, 20b. Such control is independent of the settings applied to voltage sources 28, 30, which may be chosen/varied to optimize other properties such as deposition film qualities. In one embodiment, process controller 24 varies the ion current and electron current 16, 22, respectively, in order to deliver an equal amount of positive and negative charge to target 18 during each cycle of the a-symmetric bi-polar DC voltage pulse signal discussed below. Target neutralization is required, for example, to efficiently sputter material from the target when the target is insulating. In an alternative embodiment, process controller 24 varies the ion and electron currents 16, 22, respectively, so that about 10% more negative charge than positive charge is applied to target 18 during each cycle of the a-symmetric bi-polar DC voltage pulse signal. The purpose of this alternate embodiment is to assure neutralization of target 18. It will be understood by those skilled in the art that the relative percentages of positive and negative charge supplied to target 18 by the ion and electron currents 16, 22, respectively, during any given cycle of the a-symmetric bi-polar DC voltage pulse signal, are a matter of design choice, and that variations from the embodiments described herein are within the scope of the present invention.

Process controller 24 also includes a switch driver logic circuit that switches at about 100 KHz, but those skilled in the art will recognize that alternate types of pulse control systems may be used, including systems that operate at other frequencies. A switch signal (e.g. about 100 KHz) is supplied from process controller 24 to switch 32. Switch 32, together with biasing circuitry formed from a positive voltage source 28, and a negative voltage source 30, generate an a-symmetric bi-polar DC voltage pulse signal for biasing target 18 (such as the a-symmetric bipolar DC voltage pulse signal shown in FIG. 2). The control signals P3 and P4 adjust the magnitude of the positive and negative voltages (in the a-symmetric bi-polar DC pulse signal) applied to the target 18 by the voltage sources 28, 30.

Referring now to FIG. 2, there is shown a timing diagram showing several cycles of an exemplary a-symmetric bi-polar DC pulse signal, together with diagrams showing sensed positive and negative currents at the target during several cycles of the a-symmetric bi-polar DC pulse signal, at a position proximate target 18. In the embodiment shown in FIG. 2, the amount of negative charge supplied by electron current 22 to target 18 during the positive portion of each cycle of the a-symmetric bi-polar DC voltage pulse signal is roughly equal to the amount of positive charge supplied by ion current 16 to target 18 during the negative portion of each cycle of the a-symmetric bi-polar DC voltage pulse signal. This condition is generally necessary to neutralize the target on each cycle of the a-symmetric bi-polar DC voltage pulse signal.

During operation of system 10, gas 34a, 34b (such as Ar, Xe, $N_2$, and $O_2$) is fed through the ion source 14 and the electron source 20, and bias signals from power supplies 14a, 20a are applied to sources 14, 20, respectively, to create a continuous plasma 38 proximate the target 18. The a-symmetric bi-polar DC target biasing signal causes the target 18 to alternately attractions 40 and electrons 42 from the plasma 38. The ions 40 attracted from the plasma 38 sputter the target 18. The electrons 42 attracted from the plasma 38 neutralize accumulated charge on the target 18 which charge is generally accumulated on insulating targets. Voltage source 30 supplies a negative voltage with respect to ground 44, and voltage source 28 supplies a positive voltage with respect to ground 44. In one embodiment, voltage source 28 supplies a DC voltage of about 50 V, voltage source 30 supplies a DC voltage of about −1000 V, and switch 32 toggles between its two poles at about 100 kHz. It will be understood by those skilled in the art that the particular voltage levels supplied by sources 28, 30, and the particular frequency of switch 32 are matters of design choice, and the exemplary values given should not be considered as limitative of the scope of the present invention.

A method for performing sputter deposition on the substrate 12 using the system shown in FIG. 1, will now be described. Ion current 16 is generated and directed at the target 18 by the ion source 14. Electron current 22 is generated and directed at the target 18 by the electron 1; source 20. The ion current 16, the electron current 22 and the a-symmetric bi-polar DC voltage pulse signal are independently controlled by the control system 24, by controlling voltage sources 28, 30, power supplies 14a, 20a, switch 32 and gas controllers 14b and 20b. The ion source 14 and electron source 20 create a continuous plasma 38 that is proximate the target 18. The biasing circuitry causes the target 18 to alternately attract positive ions 40 and negative electrons 42 from the plasma 38. The ions 40 that are attracted from the plasma 38 sputter the target 18. The electrons 42 that are attracted from the plasma 38 neutralize positive charge that accumulates on the target 18 during the sputtering phase. The ensuing sputtering of the target 18 creates a flux of target atoms or molecules that uniformly distributes as deposition coating 13 on the substrate 12.

Use of the present invention allows for independent adjustment of ion and electron currents 16, 22 using relatively simple circuitry. In addition, by varying the voltages supplied by power supplies 28, 30 (using, for example, process controller 24) the upper and lower voltages in the a-symmetric bi-polar DC voltage pulse signal can be independently varied, thereby varying the voltages used to attract ions during the negative portion of the pulse cycle and electrons during the positive portion of the pulse cycle. In addition, it will be understood by those skilled in the art that, by varying the switching signal supply to switch 32, the relative duration of the positive and negative portions of each cycle of the a-symmetric bi-polar DC voltage pulse signal can also be varied. Independent control of each of these parameters affords independent control of plasma properties, sputtering properties and target charge management during operation of system 10.

Figure 4A:
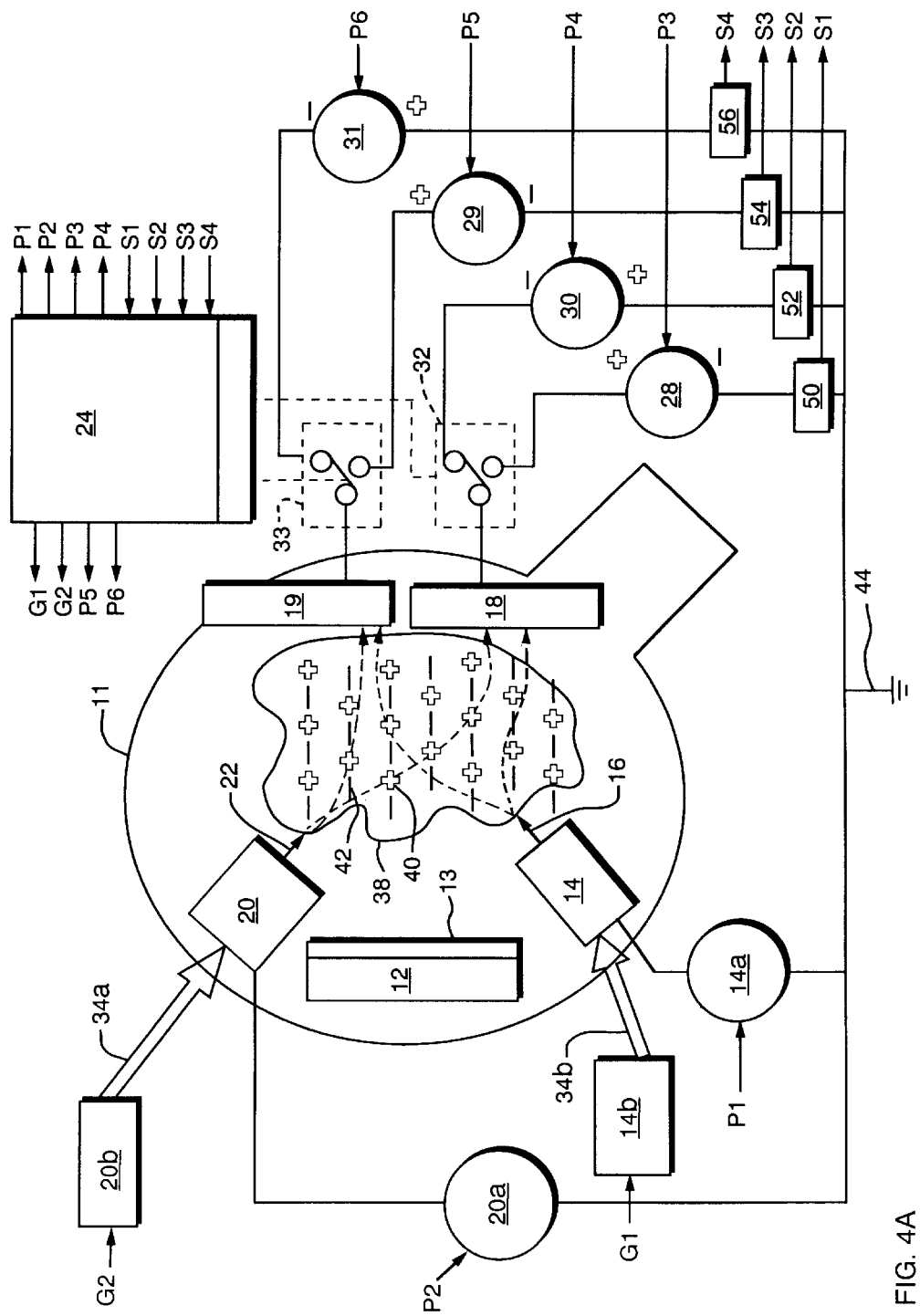
FIG. 4A is a schematic diagram of a system for performing sputter deposition using multiple targets having independent ion and electron sources, a switch for alternately connecting these sources to the associated target, and at least one current sensor for detecting positive and negative currents drawn by the associated target.
Figure 4B:
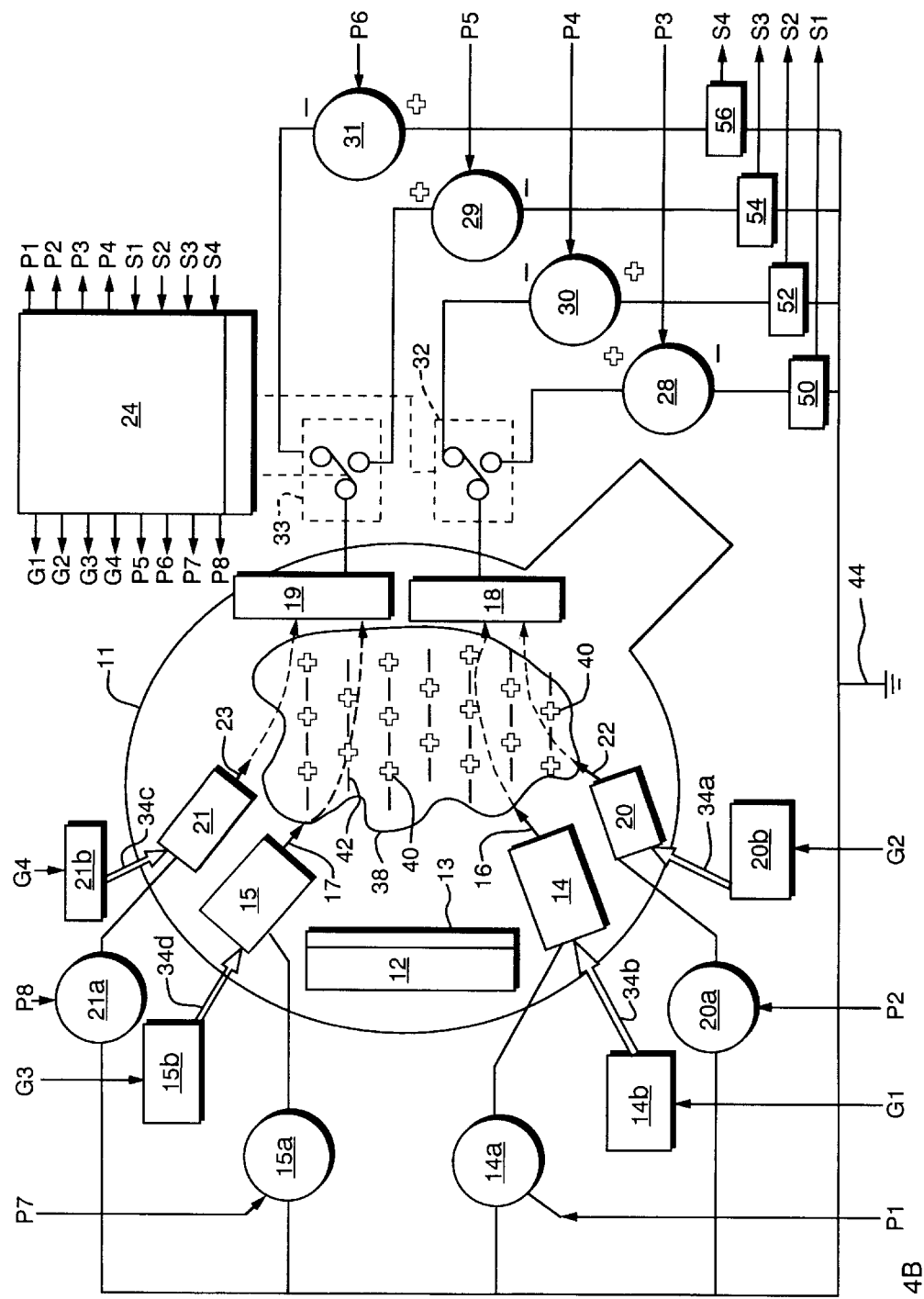
FIG. 4B is a schematic diagram of a system for performing sputter deposition using multiple targets each of which has independent ion and electron sources, a switch for alternately connecting these sources to the associated target, and at least one current sensor for detecting positive and negative currents drawn by the associated target.

The system and method for independently controlling ion and electron currents described above in FIGS. 1 and 2 can also be applied in the context of a sputter deposition system where multiple targets 18, 19 are used to simultaneously deposit materials from the targets onto a substrate. Various diagrams and arrangements where multiple targets are used to simultaneously deposit material on a substrate are shown in FIGS. 4–7. Referring particularly to FIGS. 4A, 4B, in these multi-target arrangements, the present invention achieves substantial control over the sputter deposition process by using a controller 24 that monitors currents (S1, S2, S3, S4) drawn by each target 18, 19. In response to this information, the controller 24 independently controls (i) the ion and electron currents applied to the targets, and (ii) the bi-polar DC voltage pulse used for biasing each target 18, 19, in order to achieve desired properties with respect to the film deposited on the substrate 12. In the embodiment of FIG. 4A, a single ion 14 source generates an ion current 16 that is applied to both targets 18, 19 and a single electron source 20 generates an electron current 22 that is applied to both targets 18, 19. In the FIG. 4A embodiment, the controller 24 independently varies the output of these singular ion and electron sources. By contrast, in the embodiment of FIG. 4B, multiple ion sources 14, 15 and multiple electron sources 20, 21 are used to supply independent ion currents 16, 17 and independent electron currents 22, 23 to each of the targets 18, 19, respectively. In the FIG. 4B embodiment, a first ion source 14 generates a first ion current 16 directed at a first target 18 and a second ion source 15 generates a second (independent) ion current 17 directed at a second target 19, a first electron source 20 generates a first electron current 22 directed at the first target 18 and a second electron source 21 generates a second (independent) electron current 23 directed at the second target 19. In the FIG. 4B embodiment, the controller 24 varies the first ion current 16 independently from the first electron current 22, and the controller 24 varies the second ion current 17 independently from the second electron current 23. In a further embodiment (not shown), each target may receive ions from a different ion source, while both targets receive electrons from the same electron source.

Referring now to the embodiment of FIG. 4B, a gas 34d (for example, Ar, Xe, $N_2$, or $O_2$) is supplied by a gas controller 15b (or mass flow controller) to ion source 15. The volume of gas output by gas controller 15b is varied by process controller 24. An ion source power supply 15a is coupled to the ion source 15, and supplies a control voltage to ion source 15. The output of ion source power supply 15a is varied by process controller 24. Control signals (from process controller 24) are supplied to both the ion source power supply 15a, and the ion source gas controller 15b, in order to vary the magnitude of ion current 17 at target 19. Similarly, a gas 34c (for example, Ar, Xe or $N_2$) is supplied to electron source 21 by a gas controller (or mass flow controller) 21b. Gas 34c may be of a different type than gas 34d. The volume of gas output by gas controller 21b is varied by process controller 24. An electron source power supply 21a supplies a control voltage to electron source 21. The voltage supplied to electron source 21 by electron power supply 21a is varied by process controller 24. It will be understood by those skilled in the art that by varying the quantity of gas 34c supplied to electron source 21 and the voltage supplied by electron source power supply 21a to electron source 21, the electron current emanating from electron source 21 toward the sputtering target 19 may be controlled.

The embodiments of FIGS. 4A, 4B include a further pair of current sensors 54, 56, each of which has an output that is coupled to process controller 24. Each current sensor 54, 56 preferably includes a low pass filter with a time constant that is relatively long when compared with the frequency of switch 33 (e.g., about 100 kHz.) Each current sensor 54, 56, supplies a signal S3, S4, respectively, to process controller 24 that is proportional to the output of its corresponding voltage source 29, 31, averaged over time. Although in the embodiment shown, current sensors 54, 56 are shown as being disposed between voltage sources 29, 31, respectively, and ground 44, the current sensors 54, 56 could be positioned at any location in the circuitry useful for measuring the positive and negative currents at or near target 19.

In the embodiments of FIGS. 4A, 4B, process controller 24 regulates the positive and negative currents at target 19 by varying independently the ion and electron currents 16, 22 (in the case of FIG. 4A) and 16, 17, 22, 23 (in the case of FIG. 4B) with control signals P1, P2 (and P7, P8 in the case of FIG. 4B) to power supplies 14a, 20a (and 15a, 21a in the case of FIG. 4B), and control signals G1, G2 to gas controllers 14b, 20b (and control signals G3, G4 to gas controllers 15b, 21b in the case of FIG. 4B.) Such control is independent of the settings (P3, P5, P4, P6) repectively applied to voltage sources 28, 29, 30, 31 which may be chosen/varied to optimize other properties such as deposition film qualities.

Referring still to FIGS. 4A and 4B, there are shown schematic diagrams of systems for performing sputter deposition using multiple targets. In the systems of FIGS. 4A, 4B, at least two sputter targets, each associated with a single (common) ion source and a single (common) electron source (FIG. 4A), or alternatively with its own independent ion source and independent electron source (FIG. 4B), are disposed within a vacuum chamber, along with a deposition substrate upon which it is desired to form a deposited alloy or compound film. An exemplary arrangement of these components is the "cube geometry", shown in FIG. 5 and described in U.S. patent application Ser. No. 09/810,688, filed Mar. 16, 2001, now U.S. Pat. No. 6,402,900, issued June 11, 2002, entitled "System and Method for Performing Sputter Deposition Using Ion Sources, Targets and a Substrate Arranged About the Faces of a Cube (electron sources are omitted from FIG. 5 for clarity.) Further provided for each of the at least two targets are an independent positive voltage source, an independent negative voltage source, a switch for alternately connecting these voltage sources to the target and at least one current sensor for detecting positive and negative currents drawn by the associated target. Each of the ion sources and each of the electron sources is provided with an independent power supply and a separate gas flow controller, connected by appropriate wiring and piping as is well known in the art. Finally a process controller is provided which performs the functions of 1) setting and varying the operational parameters of all the ion source and electron source power supplies and gas flows, 2) setting and varying the operational parameters of all the target positive voltage sources and negative voltage sources, 3) reading the positive and negative currents drawn by each target via the provided at least one current sensor per target and 4) driving the target switches to connect alternately the positive and negative voltages sources to the at least two targets according to a bi-polar pulse pattern controlled by a logic circuit or computer program to effect certain desired thin film deposition results. In the case of metal targets, unipolar (rather than bi-polar) pulsing may be generated by the biasing circuitry and applied to the targets —i.e. negative pulses returning to ground after each pulse. In this embodiment, the positive voltage source may be omitted from the biasing circuitry, and the unipolar pulses may be formed by switching each target switch between a negative voltage source and ground.

The at least two target switch drivers can be programmed in various way to achieve desired properties with respect to a deposited film. For example, an alloy or compound composition can be deposited on the substrate by establishing a ratio of pulse frequencies to the at least two targets. Conditions can be readily established in which the amount of target material sputtered off of a given target is the same during each negative pulse applied to the target. Likewise, the amount of sputtered material arriving at the substrate and forming a deposited film is normally proportional to the amount of material sputtered off of a given target during each negative pulse. Hence, the composition of the alloy or compound deposited film can be controlled by relatively varying the number of negative pulses per unit time applied to each of the at least two targets. In operation, the target switch drivers are activated at frequencies ranging from 1 pulse per second to 100,000 pulses per second (100 KHz). Therefore, alloy and compound compositions can be directly varied over ratios of $1:10^5$ to $10^5:1$ of the at least two chemical components (e.g., chemical elements) making up the at least two targets and used to form the alloy or compound on the substrate. Those skilled in the art will recognize that the range of thin film composition ratios of $1:10^5$ to $10^5:1$ is not a fundamental limit, since it is possible to build target switches that operate up to at least 300 KHz (or pulse more slowly on the other target) and, additionally, one can vary the operational parameters for the ion source associated with each target so that the ion current drawn during each negative pulse of the targets varies from one target to the next, thereby varying the amount of material sputtered off the target per pulse. Likewise, the voltage levels of the targets' negative voltage sources can be varied to affect the amount of material sputtered off of each target per pulse. Also, the pulse width of the negative voltage pulses can be varied from one target to the next, and the amount of material sputtered off a target during each pulse will normally be directly proportional to the length of the pulse. It is readily feasible to obtain an additional three orders of magnitude of control by these four methods, giving thin film compositional control ratios of $1:10^8$ to $10^8:1$. Again, the range of ratios is not a fundamental limit and a larger range might be obtained and still be within the scope of the present invention.

A further exemplary method of the present invention varies the programming of the target switch drivers over time during the deposition process so as to as to deposit varying composition alloys and compounds within the same thin film on the substrate, as desired. For example, a gradient-composition alloy thin film can be made in which the composition ratio varies linearly with distance through the thickness of the thin film by appropriately varying the bi-polar pulses applied to each target during the deposition process. Such composition variations can be continuous to the sub-atomic-layer level. Since a crystal plane of a typical metal contains on the order of $10^{15}$ atoms per $cm^2$, and the present invention can vary composition over a range of $1:10^8$, compositions on a single atomic plane can be controlled to at least as low as $1 \times 10^8$ atoms—$cm^2$ of one element versus $9.99999990 \times 10^{14}$ atoms·$cm^2$ of the other element. The extensions to three targets and ternary alloys, four targets and quaternary alloys, etc. obey the same sorts of ratio rules for composition. Likewise, it is clear that a gradient-composition alloy need not be deposited with linearly-varying composition ratio but may be fashioned to have a sinusoidal, parabolic, stepped or any other imaginable composition profile, within the ratio limits, by appropriate programming of the target switch drivers, the ion currents to the targets, the negative voltages to the targets, and the negative pulse widths.

Another embodiment of the invention shown in FIGS. 4A, 4B utilizes the readings from the at least two target current sensors. The process controller can be programmed to respond to random or uncontrolled systemic variations in target current in either of two ways. First, the controller can increase or decrease the ion source output current for the ion source associated with that target, with the intention of quickly (milliseconds) restoring the target current to the desired level. Secondly, the controller can change the relative number of target pulses to each target to compensate for the variance in target current. In either case, the intention is to maintain the desired alloy composition in the deposited thin film.

Another embodiment of the invention shown in FIGS. 4A, 4B controls the time-correlation of voltage pulses to differing targets. In some apparatus configurations, it is desired to avoid the condition in which multiple targets are biased positive at the same time. Since electrons in the plasma in the target region are highly mobile, large electron-currents may be drawn to the targets and the total electron current drawn by all positively-biased targets may exceed the capacity of the electron sources in the system, possibly leading to plasma instability or even extinction of the plasma. This reflects the experimentally observed result that electrons from the at least one electron source may be drawn to any positively-biased target, when electron mobility is high and plasma impedance is low, a commonly obtained condition. Another type of target-pulse time-correlation control is valuable particularly when long (~0.01 to 1 second) negative pulses to the targets are used. In these cases it is desirable to have the negative pulses applied to the targets coinciding, in order to deposit alloy material rather than very thin multi-layers of alternating pure materials. However, if very thin layers of alternating pure materials are desired, then the negative pulses may be programmed to be anti-coincident. It would also be possible to vary the time-correlation of various pulses within the deposition period of a single thin film, in order to achieve specific desired results in the deposited thin film. Likewise, given the extreme of very long (>1 second) negative target pulses, it would be obvious to run the targets with DC (direct current) continuous voltages within the apparatus of the invention, to obtain sometimes-desirable results.

Figure 5:
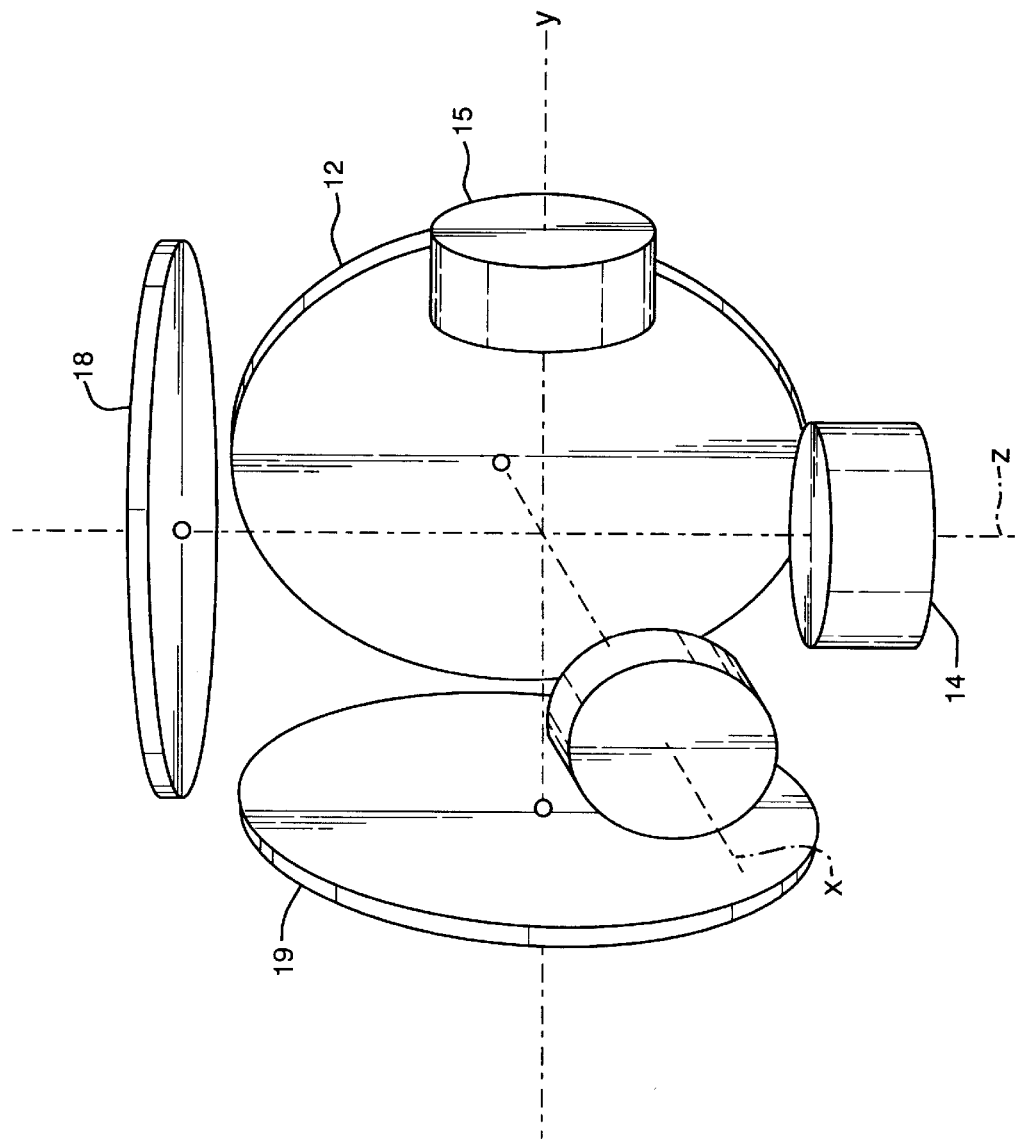
FIG. 5 is a diagram of a system for performing sputter deposition on a substrate using a cube geometry according to the present invention.
Figure 6A:
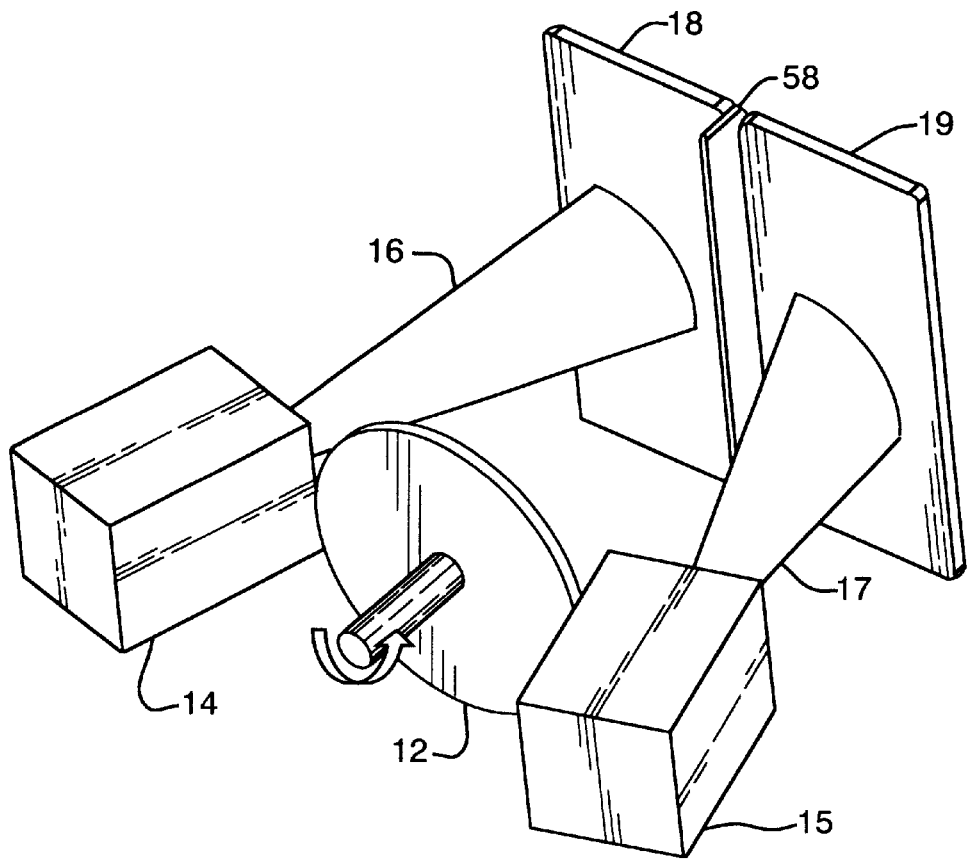
FIG. 6A is an isometric view of a multi-target system for performing sputter deposition wherein the faces of the targets are arranged such that there is no line of sight between the faces of any two targets, in accordance with one embodiment of the invention.
Figure 6B:
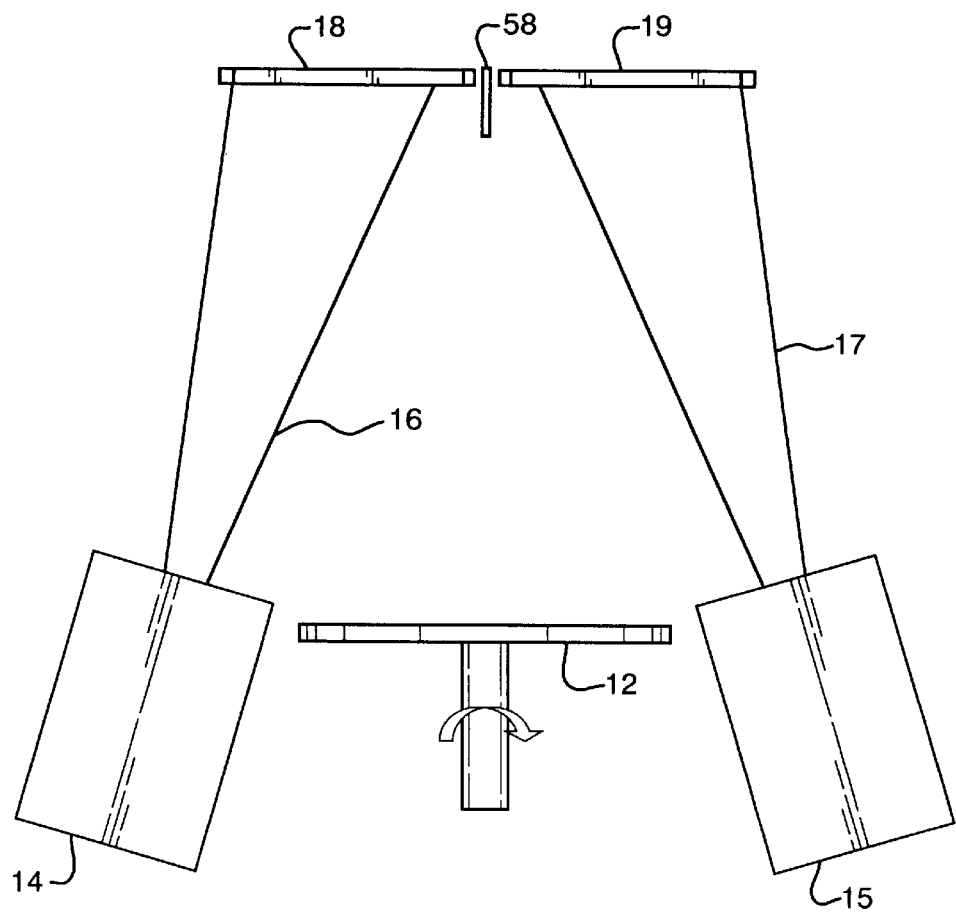
FIG. 6B is a top view of the system shown in FIG. 6A.
Figure 7:
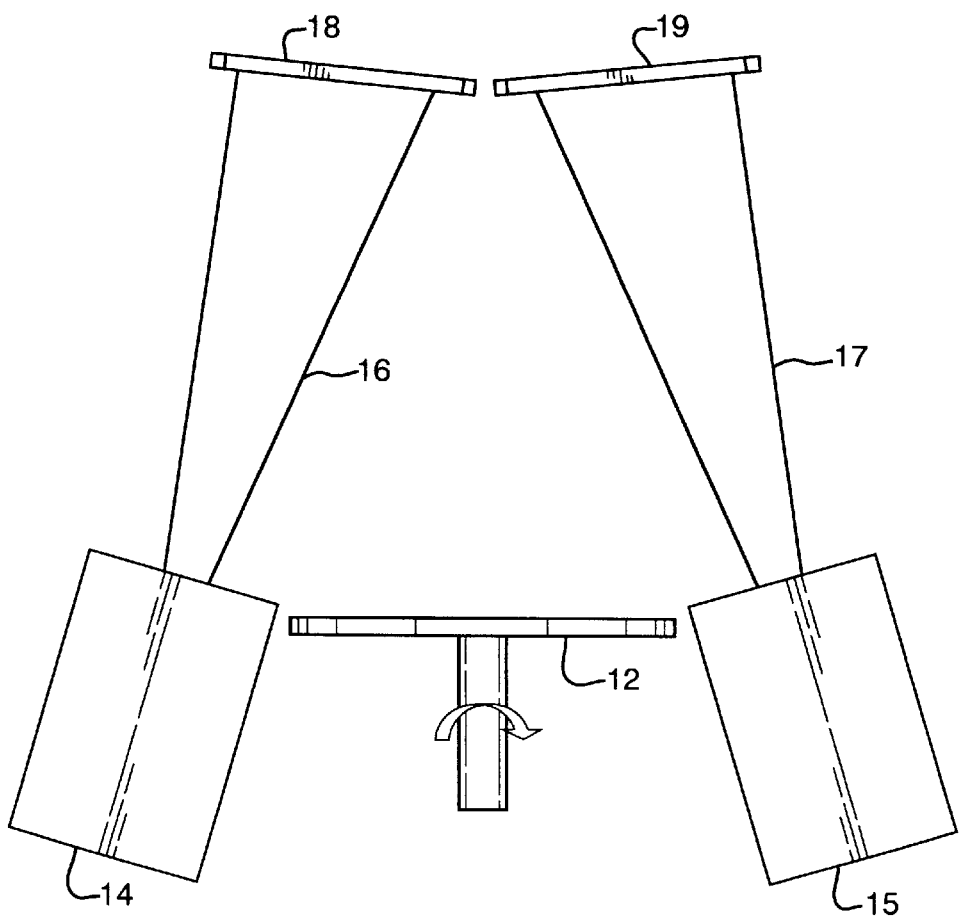
FIG. 7 is a diagram of a multi-target system for performing sputter deposition wherein the faces of the targets are arranged such that there is no line of sight between the faces of any two targets, in accordance with an alternative embodiment of the invention.

The control systems shown in FIGS. 4A, 4B can be applied to various geometric arrangements of the targets within the apparatus. A "cube geometry" is shown in FIG. 5. In the embodiment of FIG. 5, the substrate 12 rotates about the x axis, and the central axis of the ion source facing substrate 12 corresponds to the x axis; the face of target 18 is perpendicular to the z axis, and the central axis of ion source 14 corresponds to the z axis; the face of target 19 is perpendicular to the y axis, and the central axis of ion source 15 corresponds to the y axis; and the x, y and z axis are orthogonal to each other. The arrangements shown in FIGS. 6A, 6B and 7 are relevant where extreme ratios of alloy composition (i.e., far from 1:1 ratio), and hence extreme ratio of target pulses from one target to another, are desired. In such cases, the target receiving fewer negative pulses will start to become contaminated by material sputtered off of the at least one other target and depositing on the lesser-active target(s). This effect, known as cross-contamination, can be minimized by arranging the faces of the targets as shown in FIGS. 6A, 6B and 7 (the electron sources are omitted from these figures for purposes of illustration, however, such sources are included in the actual embodiments) so that there is no line-of-sight between the face of any target to the face of any other target. Cross-contamination may be further minimized by positioning a shield 58 between the targets 18, 19, as shown in FIGS. 6A, 6B. In the embodiment of FIGS.

6A, 6B, the faces of targets 18, 19 are co-planar. By contrast, in the FIG. 7 embodiment, the planes defined by the faces of targets 18, 19 are offset. It will be understood that there will be slight variations upon the exact angles and distances that still fall within the spirit of the present invention.

The present invention allows a much wider range of alloy composition (at least $1:10^8$ to $10^8:1$) to be deposited, with relative ease, compared with other known co-sputtering techniques. The wide-ranging independent control of negative voltages applied to the targets and, in the FIG. 4B embodiment, the wide-ranging, independent control of ion current to the targets allowed by the independent ion sources, are particularly advantageous over other co-sputtering techniques. The present invention can be applied to form rugate filters, with sinusoidal-varying composition, which create a narrow-band reflector. Another application is deposition of magnetic alloys such as permalloy ($Ni_xFe_{1-x}$) and CoPt, which are used in thin film disk heads. Another application is advanced transistor gate metals, which may be TiTa alloys, in which the ratio of alloy composition needs to be varied to match the work function to that of other parts of the transistor.

Figure 3A:
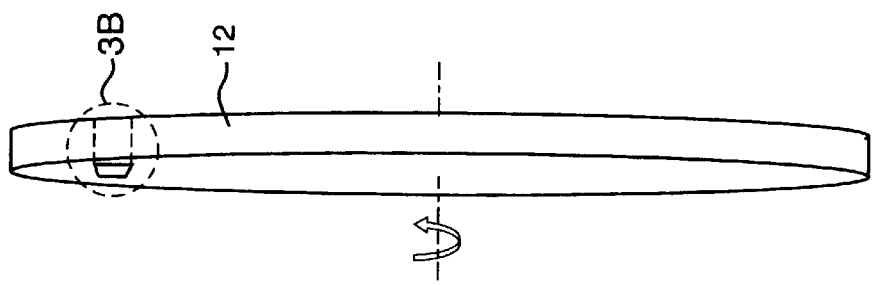
FIGS. 3A, 3B show an exemplary optical filter formed using the system and method of the present invention.
Figure 3B:
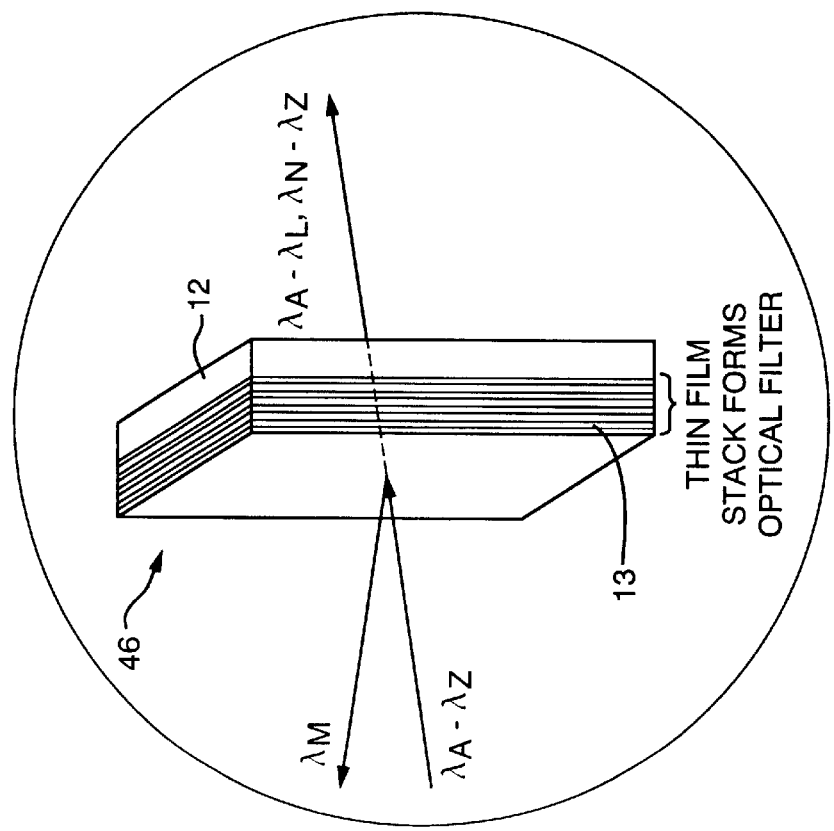

The above systems and processes may be advantageously used to create an optical filter 46. As shown in FIGS. 3A, 3B filter 46 receives wavelengths $\lambda_A$-$\lambda_Z$, reflects $\lambda_M$ and passes $\lambda_A$-$\lambda_L$, $\lambda_{N-\lambda Z}$ and is therefore a narrow-band reflection filter. When the present invention is used to form an optical filter, a material (preferably a dielectric) is deposited on the substrate using: at least one ion source that generates at least one ion current directed at first and second targets; at least one electron source that generates at least one electron current directed at the first and second targets; a first and a second target with composition suitable for depositing the desired dielectric material on the substrate (preferably amorphous tantalum oxide and amorphous silicon oxide); biasing circuitry that biases the first target with a first DC voltage pulse signal and that biases the second target with a second DC voltage pulse signal that is independent of the first DC voltage pulse signal, the biasing circuitry being formed from at least one voltage source with respect to ground, a first high frequency switch used to form the first DC voltage pulse signal, and a second high frequency switch used to form the second DC voltage pulse signal; a first current sensor, coupled to the biasing circuitry, that monitors a positive current and a negative current from the first target during one or more cycles of the first DC voltage pulse signal; a second current sensor, coupled to the biasing circuitry, that monitors a positive current and a negative current from the second target during one or more cycles of the second DC voltage pulse signal; a controller, coupled to the first and second current sensors, that varies the at least one ion current independently from the at least one electron current; and a controller which varies the voltage pulse signals and the ion currents to the first target and the second target to control the composition of material deposited on the substrate according to a predetermined and desirable composition ratio as a function of thickness through the deposited material. The material deposited on the substrate has sinusoidal variation of composition ratio with respect to thickness through the deposited material. The material deposited on the substrate has sinusoidal variation in refractive index with respect to thickness through the deposited material, preferably corresponding to the variation in composition. This sinusoidal variation is typical of a rugate filter. The range of sinusoidal variation in composition is from pure tantalum oxide to pure silicon oxide, with continuously changing mixed compositions (of sinusoidal profile) in between. The mixed compositions are logically equivalent to "alloys" referred to in other parts of this specification, even though variable-composition dielectric compounds are not normally referred to as "alloys" in the art. The deposition of and thermal stability of variable-composition dielectric compounds is improved if the atomic structure of the compounds is, preferably, amorphous. The period (characteristic length) of the sinusoidal variation in composition, and the thickness of the material deposited on the substrate is low-order multiples and/or fractions of the optical thickness at the wavelength of light that the filter will serve to isolate. The filter 46 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of filters on the smaller pieces, that deposited materials other than tantalum oxide and silicon oxide could be used for the filter, as long as the refractive index contrast was sufficiently large, and that a variety of differing designs for variation of refractive index as a function of distance through the deposited material might be employed to create a filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A multi-target system for performing sputter deposition, comprising:
   (a) at least one ion source that generates at least one ion current directed at least first and second targets;
   (b) at least one electron source that generates at least one electron current directed at the at least first and second targets;
   (c) biasing circuitry that biases the first target with a first DC voltage pulse signal and that biases the second target with a second DC voltage pulse signal that is independent of the first DC voltage pulse signal, the biasing circuitry being formed from at least one voltage source with respect to ground, a first high frequency switch used to form the first DC voltage pulse signal, and a second high frequency switch used to form the second DC voltage pulse signal;
   (d) a first current sensor, coupled to the biasing circuitry, that monitors a positive current and a negative current from the first target during one or more cycles of the first DC voltage pulse signal;
   (e) a second current sensor, coupled to the biasing circuitry, that monitors a positive current and a negative current from the second target during one or more cycles of the second DC voltage pulse signal;
   (f) a controller, coupled to the first and second current sensors, that varies the at least one ion current independently from the at least one electron current;
   (g) wherein the at least one ion source and the at least one electron source create a continuous plasma proximate the first and second targets, and the biasing circuitry causes the first and second targets to alternately attract ions and electrons from the plasma;
   (h) wherein the ions attracted from the plasma sputter the first and second targets and material from the first and second targets is deposited on a substrate; and (i) wherein the electrons attracted from the plasma neutralize accumulated charge on the first and second targets.

2. The system of claim 1, wherein material from the first target deposited on the substrate corresponds to a first component of an alloy, and material from the second target deposited on the substrate corresponds to a second component of the alloy.

3. The system of claim 2, wherein the controller varies a composition ratio of the first and second components of the alloy deposited on the substrate by independently varying a number of negative pulses per unit time in each of the first and second DC voltage pulse signals.

4. The system of claim 2, wherein the controller varies a composition ratio of the first and second components of the alloy deposited on the substrate by independently varying a length of negative pulses per unit time in each of the first and second DC voltage pulse signals.

5. The system of claim 2, wherein the controller varies a composition ratio of the first and second components of the alloy deposited on the substrate by independently varying an amplitude of negative pulses in each of the first and second DC voltage pulse signals.

6. The system of claim 2, wherein the controller varies a composition ratio of the first and second components of the alloy deposited on the substrate by varying an amplitude of the at least one ion current during pulses in each of the first and second DC voltage pulse signals.

7. The system of claim 2, wherein the controller varies the composition ratio over time such that the composition ratio of the alloy deposited on the substrate varies throughout a thickness of a film deposited on the substrate.

8. The system of claim 7, wherein the composition ratio of the alloy deposited on the substrate varies linearly throughout the thickness of the film deposited on the substrate.

9. The system of claim 7, wherein the composition ratio of the alloy deposited on the substrate varies in a sinusoidal fashion throughout the thickness of the film deposited on the substrate.

10. The system of claim 7, wherein the composition ratio of the alloy deposited on the substrate varies in a parabolic fashion throughout the thickness of the film deposited on the substrate.

11. The system of claim 7, wherein the composition ratio of the alloy deposited on the substrate varies as a step function within the thickness of the film deposited on the substrate.

12. The system of claim 1, wherein the controller applies the first and second DC voltage pulse signals to the first and second targets, respectively, in a manner that avoids a simultaneous positive biasing of the first and second targets.

13. The system of claim 1, wherein the first and second DC voltage pulse signals correspond to first and second bi-polar DC voltage pulse signals, respectively.

14. The system of claim 13, wherein the biasing circuitry is formed from at least one positive voltage source with respect to ground, at least one negative voltage source with respect to ground, a first high frequency switch used to form the first bi-polar DC voltage pulse signal, and a second high frequency switch used to form the second bi-polar DC voltage pulse signal.

15. The system of claim 1, wherein the at least one ion source, the at least one electron source and the first and second targets are disposed in a chamber having a pressure between $10^{-2}$ to $10^{-5}$ torr during operation of the system.

16. The system of claim 1, wherein the controller varies the first DC voltage pulse signal used to bias the first target independently from the ion and electron currents.

17. The system of claim 16, wherein the controller varies the second DC voltage pulse signal used to bias the second target independently from the ion and electron currents.

18. The system of claim 1, wherein the first DC voltage pulse signal is an a-symmetric bi-polar DC voltage pulse signal.

19. The system of claim 18, wherein the second DC voltage pulse signal is an a-symmetric bi-polar DC voltage pulse signal.

20. The system of claim 1, wherein a face of the first target is outside of a line-of-sight of a face of the second target, and the face of the second target is outside of a line-of-sight of the face of the first target.

21. The system of claim 20, where the first and second targets have faces that lie in a common plane.

22. The system of claim 20, where the first and second targets have faces that lie in different planes.

23. The system of claim 20, further comprising a shield positioned between the first and second targets, wherein the shield prevents cross-contamination between the first and second targets.

24. The system of claim 1, wherein the at least one ion source comprises a first ion source that generates a first ion current directed at the first target and a second ion source that generates a second ion current directed at the second target; wherein the at least one electron source comprises a first electron source that generates a first electron current directed at the first target and a second electron source that generates a second electron current directed at the second target; wherein the controller varies the first ion current independently from the first electron current, and the controller varies the second ion current independently from the second electron current.

25. A method for performing sputter deposition, comprising the steps of:
  (a) generating an ion current directed at least first and second targets with at least one ion source;
  (b) generating an electron current directed at the at least first and second targets with at least one electron source;
  (c) biasing the first target with a first DC voltage pulse signal and biasing the second target with a second DC voltage pulse signal that is independent of the first DC voltage pulse signal;
  (d) monitoring, with a first current sensor, a positive current and a negative current from the first target during one or more cycles of the first DC voltage pulse signal;
  (e) monitoring, with a second current sensor, a positive current and a negative current from the second target during one or more cycles of the second DC voltage pulse signal;
  (f) varying, in response at least in part on outputs of the first and second current sensors, the ion current independently from the electron current;
  wherein the at least one ion source and the at least one electron source create a continuous plasma proximate the first and second targets, and the biasing causes the first and second targets to alternately attract ions and electrons from the plasma;
  wherein the ions attracted from the plasma sputter the first and second targets and material from the first and second targets is deposited on a substrate; and
  wherein the electrons attracted from the plasma neutralize accumulated charge on the first and second targets.

* * * * *